(12) United States Patent
Palm et al.

(10) Patent No.: US 10,734,351 B2
(45) Date of Patent: Aug. 4, 2020

(54) CHIP ASSEMBLING ON ADHESION LAYER OR DIELECTRIC LAYER, EXTENDING BEYOND CHIP, ON SUBSTRATE

(71) Applicant: Infineon Technologies AG, Neubiberg (DE)

(72) Inventors: Petteri Palm, Regensburg (DE); Thorsten Scharf, Regensburg (DE); Ralf Wombacher, Burglengenfeld (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/107,264

(22) Filed: Aug. 21, 2018

(65) Prior Publication Data

US 2018/0358326 A1 Dec. 13, 2018

Related U.S. Application Data

(60) Continuation of application No. 15/632,680, filed on Jun. 26, 2017, now Pat. No. 10,056,348, which is a (Continued)

(30) Foreign Application Priority Data

Feb. 4, 2014 (DE) .................. 10 2014 101 366

(51) Int. Cl.
*H01L 23/00* (2006.01)
*H01L 23/538* (2006.01)
(Continued)

(52) U.S. Cl.
CPC ............ *H01L 24/82* (2013.01); *H01L 21/486* (2013.01); *H01L 21/4853* (2013.01); *H01L 21/78* (2013.01); *H01L 23/055* (2013.01);

*H01L 23/481* (2013.01); *H01L 23/5384* (2013.01); *H01L 23/5385* (2013.01); *H01L 23/5386* (2013.01); *H01L 23/5389* (2013.01); (Continued)

(58) Field of Classification Search
CPC ..... H01L 25/0655; H01L 23/48; H01L 23/50; H01L 24/83; H01L 23/481; H01L 23/055; H01L 23/5389; H01L 24/25; H01L 24/97; H01L 24/80; H01L 21/78
See application file for complete search history.

(56) References Cited

U.S. PATENT DOCUMENTS 6,072,240 A 6/2000 Kimura et al.
2003/0227095 A1 12/2003 Fujisawa
(Continued)

FOREIGN PATENT DOCUMENTS

EP 2019429 1/2009

*Primary Examiner* — Ahmed N Sefer
(74) *Attorney, Agent, or Firm* — Dicke, Billig & Czaja, PLLC

(57) ABSTRACT

Electronic module, which comprises a first substrate, a first dielectric layer on the first substrate, at least one electronic chip, which is mounted with a first main surface directly or indirectly on partial region of the first dielectric layer, a second substrate over a second main surface of the at least one electronic chip, and an electrical contacting for the electric contact of the at least one electronic chip through the first dielectric layer, wherein the first adhesion layer on the first substrate extends over an area, which exceeds the first main surface.

19 Claims, 7 Drawing Sheets

Related U.S. Application Data division of application No. 14/613,446, filed on Feb. 4, 2015, now abandoned.

(51) Int. Cl.
  *H01L 21/78* (2006.01)
  *H01L 23/055* (2006.01)
  *H01L 23/48* (2006.01)
  *H01L 21/48* (2006.01)
  *H01L 21/56* (2006.01)
  *H01L 23/498* (2006.01)

(52) U.S. Cl.
  CPC .............. *H01L 24/25* (2013.01); *H01L 24/83* (2013.01); *H01L 24/97* (2013.01); *H01L 21/561* (2013.01); *H01L 21/568* (2013.01); *H01L 23/49816* (2013.01); *H01L 2224/04105* (2013.01); *H01L 2224/24137* (2013.01); *H01L 2224/2518* (2013.01); *H01L 2224/32225* (2013.01); *H01L 2224/73267* (2013.01); *H01L 2224/82039* (2013.01); *H01L 2224/8285* (2013.01); *H01L 2224/83005* (2013.01); *H01L 2224/83132* (2013.01); *H01L 2224/83191* (2013.01); *H01L 2224/83192* (2013.01); *H01L 2224/92144* (2013.01); *H01L 2224/97* (2013.01); *H01L 2924/12042* (2013.01); *H01L 2924/13055* (2013.01); *H01L 2924/13091* (2013.01)

(56) References Cited

U.S. PATENT DOCUMENTS

| | | |
|---|---|---|
| 2005/0056903 A1* | 3/2005 | Yamamoto ........ H01L 21/76898 257/433 |
| 2005/0121765 A1 | 6/2005 | Lin |
| 2006/0003495 A1 | 1/2006 | Sunohara |
| 2006/0284187 A1* | 12/2006 | Wierer, Jr. ............. B82Y 20/00 257/79 |
| 2007/0045638 A1* | 3/2007 | Shen ....................... H01L 33/32 257/94 |
| 2008/0052906 A1 | 3/2008 | Lee |
| 2008/0196930 A1 | 8/2008 | Tuominen |
| 2008/0261338 A1 | 10/2008 | Ilhola |
| 2009/0008765 A1* | 1/2009 | Yamano .................. H01L 24/83 257/690 |
| 2009/0072384 A1 | 3/2009 | Wong |
| 2010/0202126 A1 | 8/2010 | Nakamura et al. |
| 2010/0258944 A1 | 10/2010 | Uchiyama |
| 2010/0295171 A1 | 11/2010 | Otremba |
| 2011/0001245 A1* | 1/2011 | Jobetto ................. H01L 21/486 257/773 |
| 2011/0062600 A1 | 3/2011 | Ueno et al. |
| 2011/0203107 A1 | 8/2011 | Schrittwieser et al. |
| 2013/0021766 A1* | 1/2013 | Mahler ................... H01L 24/27 361/772 |
| 2013/0075936 A1 | 3/2013 | Lin |

* cited by examiner

FIG 6

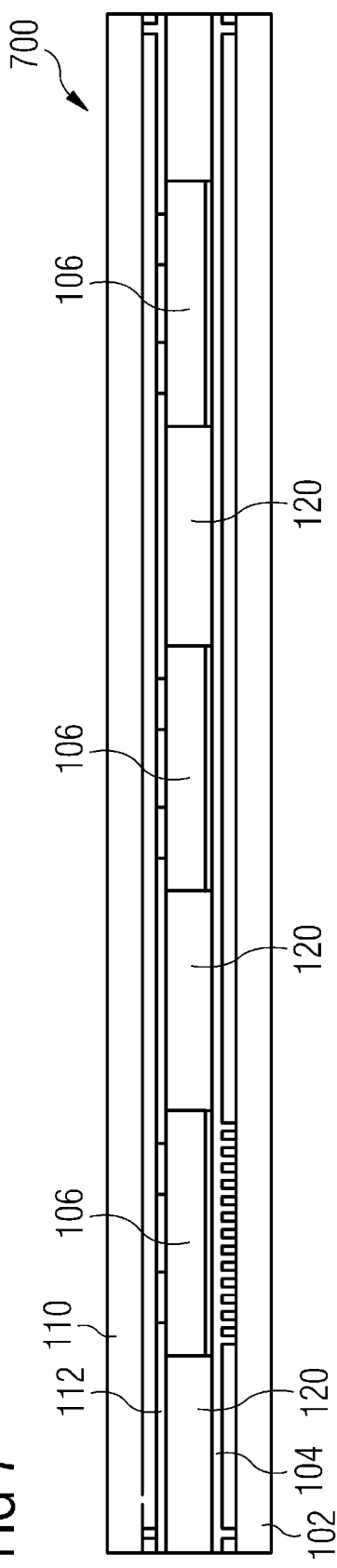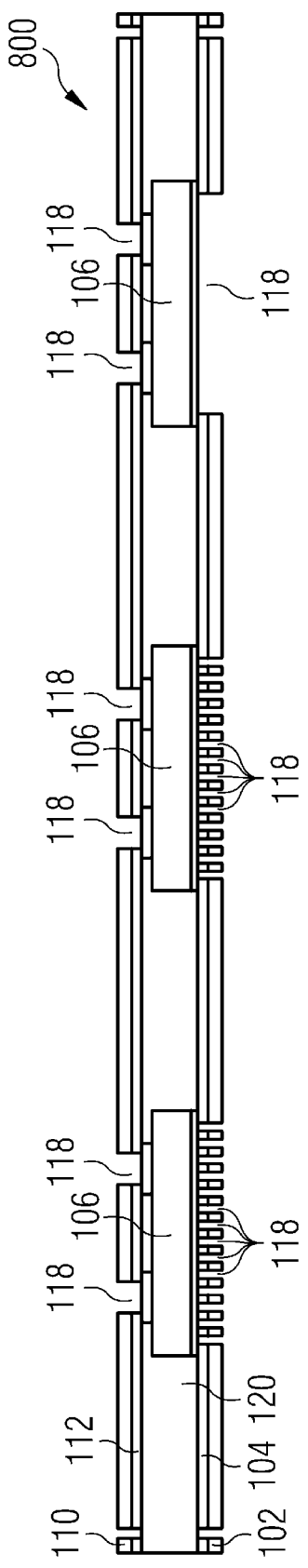

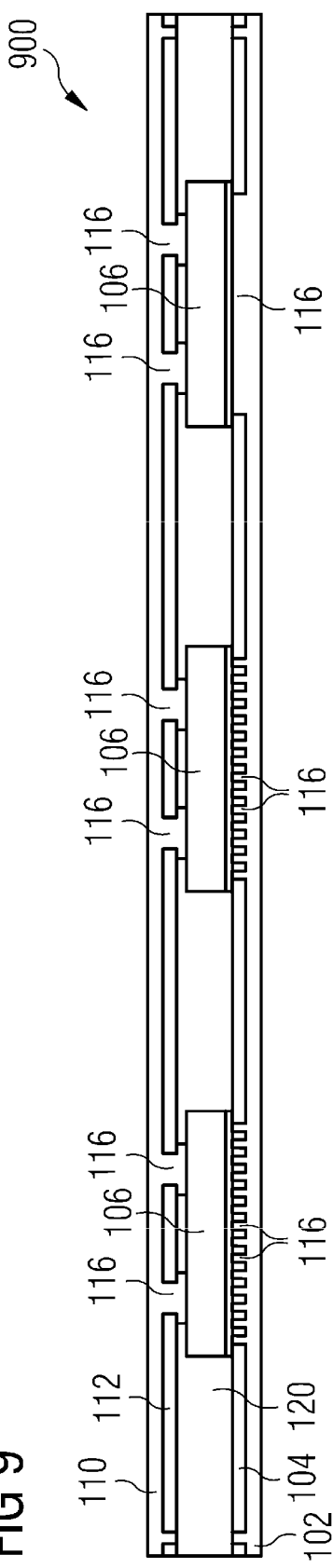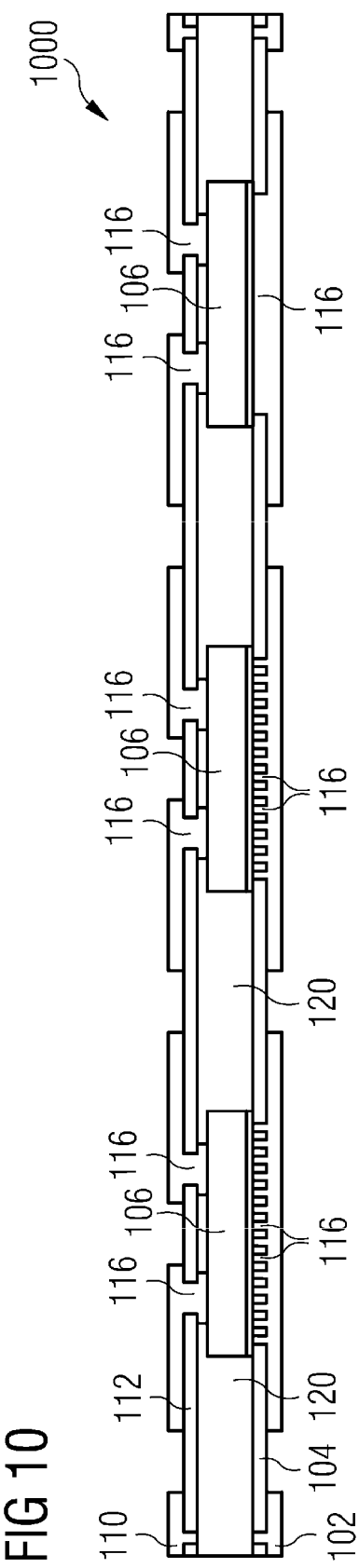

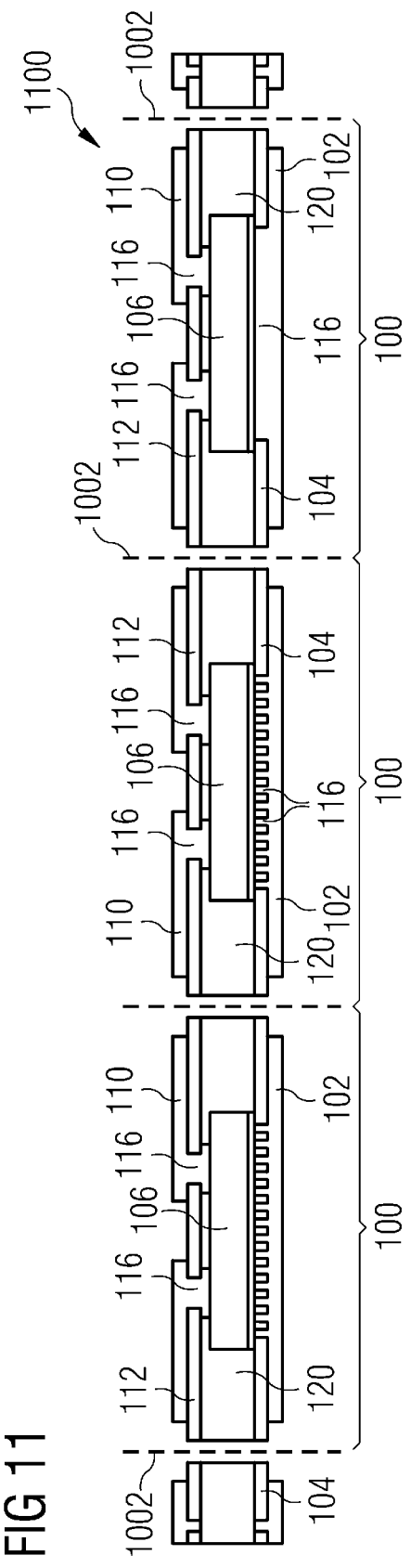

CHIP ASSEMBLING ON ADHESION LAYER OR DIELECTRIC LAYER, EXTENDING BEYOND CHIP, ON SUBSTRATE

CROSS REFERENCE TO RELATED APPLICATION

The present application is a continuation application of U.S. patent application Ser. No. 15/632,680 filed Jun. 26, 2017, which is a divisional of U.S. patent application Ser. No. 14/613,446, filed Feb. 4, 2015 and claims priority to German Patent Application No. 10 2014 101 366.2, filed Feb. 4, 2014, all of which are incorporated herein by reference.

BACKGROUND

Field

Various embodiments in general relate to an electronic module and method for producing of at least one electronic module.

Description of the State of the Art

Electronic modules can comprise one or more electronic chips which are for example encapsulated in an encapsulation structure and can be connected to an electronic periphery through electrically conductive contacts.

It is also possible to produce an electronic module, while electronic chips are mounted between two metallic substrates and spaces are filled with prepreg material. In conventional processes of the type described, high temperatures can occur, which may negatively affect the electronic chips. Even a tilt-free mounting of electronic chips between two metallic substrates is a technological challenge.

SUMMARY

There might be a need for an electronic module which can be manufactured easily and be robust against errors.

According to an exemplary embodiment, an electronic module is provided, which provides a (in particular, electrically conductive) first substrate, a first dielectric layer on the first substrate (in particular, electrically insulating), at least one electronic chip, which is mounted on a section of the first dielectric layer, with a first main surface directly (i.e. with direct contact between the electronic chip and the first dielectric layer and thus without a component arranged between the electronic chip and the first dielectric layer) or indirectly (i.e. without direct contact between the electronic chip and the first dielectric layer and thus with a component between the electronic chip and the first dielectric layer like, for example, an additional dielectric structure), a second (in particular, electrically conductive) substrate over a second main surface of the at least one electronic chip, and an electrical contact for making electrical contact with the at least one electronic chip through the first dielectric layer. The first dielectric layer can extend on the first substrate over an area, which exceeds the first main surface.

According to another exemplary embodiment example, a method for producing at least one electronic module is provided, wherein in the method a first adhesion layer is applied at least to an entire component mounting area of a first substrate, a first main surface of at least one electronic chip is mounted directly or indirectly on a section of the first adhesion layer, a second substrate is applied over a second main surface of the at least one electronic chip, and the at least one electronic chip is electrically contacted through the first adhesion layer.

According to yet another exemplary embodiment example, a method for producing at least one electronic module is provided, wherein in the method a first adhesion layer is applied at least to an entire component mounting area of a first substrate, a first main surface of a plurality of electronic chips is mounted directly or indirectly on a respective partial region of the first adhesion layer, a second adhesion layer is applied to a second substrate, and a second main surface of the plurality of electronic chips is mounted directly or indirectly on a respective partial region of the second adhesion layer.

An exemplary embodiment example has the advantage that one or more adhesion layers formed during the manufacturing method (which after completion of the manufacturing method, i.e. the completed electronic module, in the case of an electrically insulating material of the adhesion layer is called dielectric layer) will be used for single-sided or double-sided mounting of one or more electronic chips for manufacturing of an electronic module. This enables the mounting of electronic chips on the substrates by the adhesion layer(s) at low temperatures, resulting in a saving of electronic chips and as a result leading to a quality improvement of the manufactured electronic modules. By providing a substantially complete or full-surface adhesion layer on at least one main surface of the electronic chip, the adhesion material can be provided in a very good homogeneity, especially with a very uniform thickness, so that an unwanted tilting of an electronic chip during the assembly on or over a such adhesion layer can be reliably avoided. Tilting and unwanted hollow spaces inside of the electronic module can be avoided through the assembly technique described, because according to exemplary embodiments neither a precise dosing of adhesive material nor a precise positioning of adhesive material is critical. With the described assembly architecture, the number of different materials and material surfaces can be kept so small, that problems with different thermal expansion coefficients of different components of the electronic module and an unwanted thermal mismatch can be avoided. According to exemplary embodiment examples, the manufacturing method can be made easily, and a list of required components and materials can be kept small.

One or preferably two-sided large-area applying of a relevant adhesion layer on the respective substrate, for preferably sandwiching of the electronic chip(s) between two substrate adhesion layer stacks, has technical advantages. From one side, the applying of planar and essentially continuous adhesion layers leads to an improved protection of electronic chips against tilting during assembly and against undesired moving caused by force of adhesion of the electronic chip(s) from a desired position of adhesion. Large planar layers of adhesion material provide for a more tolerant positioning in this respect and have less tilt inclination for chips during the chip assembly. Also providing a large adhesion layer significantly extending over the electronic chips allows a simple and slight position-critical placement of the electronic chips and therefore results in total in less alignment effort. If the adhesion layer(s) is or are designed essentially full-surface in the component assembly area of the substrate(s), it or they can perceive its or their adhesive function for various module components across a larger area, resulting in a reduced risk of unwanted hollow spaces inside of the electronic module. Through optional providing of dielectric structures (also denoted as fill structures or laminate structures, for example so called prepregs) for filling out hollow spaces in the electronic module, a large adhesion layer can manage or support not only the mounting of the electronic chip to the respective substrate, but even the mounting of the dielectric structure on substrate and/or electronic chip. Furthermore, even the number of used dielectric structures can be reduced or kept small.

DESCRIPTION OF OTHER EMBODIMENT EXAMPLES

In the context of the present invention, the term "adhesion layer" can indicate in particular an extended and continuous layer with an even thickness of an adhesive material. The adhesive material can be so designed, that if an electronic chip (or other module component) is merely placed on the adhesive material, a mounting connection between the electronic chip (or the other module component) and the adhesion layer will be formed. In particular polymer, for example epoxy or filled epoxy, can be used as adhesion material of the adhesion layer.

In the context of the present invention, the term "dielectric layer" can describe in particular a layer composed of electrically insulating material that has been manufactured from the adhesion layer and forms part of the completed electronic module. Through a hardening of at least a part of the adhesion layer during manufacturing process, it can lose its adhesive nature entirely or partially and will therefore be indicated in the context of this application as a component of the completed electronic module, also as the dielectric layer.

In the context of the present invention, the term "component mounting area" can in particular indicate a surface area of the respective substrate, on which the functional components (in particular the chip(s), if applicable, a dielectric structure, etc.) of the manufactured electrical module(s) shall be mounted. In other words, the component assembly area forms at the end of the manufacturing process preferably a part of completed electronic module. A ring-shaped outer margin area of the substrate cannot belong to the preferably full-surface component mounting area, which shall be covered with the adhesive material, which can remain free of adhesion material (but must not) and from which no electronic modules must be obtained. Also optional alignment markers ("alignment markers"), which during the manufacturing process are used as orientation and/or positioning help for equipment to be able to perform certain procedures (for example, place of a chip assembly, definition of areas of etching, etc.) especially with exact position, cannot belong to the preferably full-surface component mounting area, which shall be covered with the adhesive material.

According to an exemplary embodiment, an ultra-thin electronic module can be manufactured, for example, from at least two electronic chips, wherein one of the chips can be oriented in one direction and the other can be oriented in the opposite direction. Such an electronic module is able to withstand high currents and currents which are flowing in the vertical direction (for example 10 amperes and more), wherein a low resistance and a strong suppression can be obtained from parasitic effects. With the mounting technology according to exemplary embodiment examples, the handling of very small and very thin electronic chips in connection with the placing and mounting of electronic chips to the respective substrate is possible easily and robust against errors, because the requirements to the accuracy of applying of adhesion material are low in the terms of quantity and position. Through the application of a full layer of adhesive material (for example, resin) on the respective substrate, the requirement of applying of precise quantities of adhesion material at precise positions can be elegantly avoided. According to exemplary embodiment examples, the adhesion material can be applied using silk screen. Especially when the use of two pressure stages of successive applying of two parallel and vertically arranged parts of layers of adhesive material, an unwanted tilting of electronic chips can be effectively suppressed, because the lower part of layer can be used for the reliable electrical insulation and the upper part of layer can be used for firmly pressing of the electronic chips to be mounted. According to an exemplary embodiment example, thus an embedded module can be created, at which at least one electronic chip will be linked to a particular pressed adhesion layer on both sides.

Afterwards, more exemplary embodiment examples of the module and the methods will be described.

According to an exemplary embodiment example, it is possible to provide an adhesion layer or dielectric layer only on one side or main surface of electronic chips. A version with the adhesion layer or dielectric layer on one side can be meaningful for example, if the electronic chips show only one direction. Then a dielectric structure can be laminated on the other side, for example prepreg.

According to an exemplary embodiment example, the electronic module has a second dielectric layer on the second substrate, wherein at least one electronic chip is mounted with its second main surface directly or indirectly on a section area of the second dielectric layer. In the electronic module, arranged dielectric layers can be provided thus beneficial on both sides of the electronic chip(s), for example, if several electronic chips show different or opposite directions.

The first adhesion layer or dielectric layer can be designed on the first substrate as a continuous adhesion layer or dielectric layer. The second adhesion layer or dielectric layer can be designed on the second substrate in appropriate way as a continuous adhesion layer or dielectric layer. In the context of the present intention, the term "continuous" can indicate in particular that the respective adhesion layer or dielectric layer can be designed without isolated islands.

The first adhesion layer or dielectric layer of the electronic module can be interrupted, for example, only through the electrical contact (i.e. otherwise completely), otherwise can cover the entire first substrate of the electronic module. The second adhesion layer or dielectric layer of the electronic module can be placed in appropriate way, interrupted only through the electrical contact (i.e. otherwise completely), otherwise can cover the entire second substrate of the electronic module.

The first adhesion layer or dielectric layer can have a uniform or constant thickness on the first substrate. The second adhesion layer or dielectric layer can have a uniform or constant thickness on the second substrate in appropriate way.

The first adhesion layer or dielectric layer can extend across an area over the first substrate, which has at least double size of the first main surface. The first adhesion layer or dielectric layer can contact even a dielectric structure section by section on the first substrate (for example a prepreg). Accordingly, the second adhesion layer or dielectric layer can be extended across an area on the second substrate, which has at least double size of the second main surface. The second adhesion layer or dielectric layer can contact even a dielectric structure section by section on the second substrate (for example a prepreg).

According to an embodiment example, at least one of the first substrate and of the second substrate is a structured, especially metallic foil. The foil can have such low thickness, that it is flexible and therefore can be adapted to the electronic chips to be contacted. With flat foils, a plurality of electronic chips can be used, in order to simultaneous or batch-type manufacturing of multiple electronic modules to be connected or mounted, so an efficient manufacturing process is allowed. In the complete manufactured electronic module, the respective foil as a first or second substrate can have, for example, a thickness of 3 μm to 20 μm. During the manufacturing process of electronic chips, a thicker multi-layer foil and therefore having a stabilizing effect in light of the handling of the thin electronic chips can be used as a first substrate and a second substrate, which has a temporary carrier and a removable functional layer thereof. The temporary carrier can have, for example, a thickness in a range between 35 μm and 200 μm, whereas the functional layer, for example, can have a thickness between 5 μm and 20 μm.

According to an embodiment example, at least one of the first substrate and of the second substrate is manufactured from an electrically conductive material. If the foils are manufactured from electrically conductive material, they can contact the electronic chips through an electronic periphery. For example, the substrates can be produced from aluminum or copper foils. Such substrates have also a high thermal conductivity, so the substrates can contribute to the heat removal of the electronic chips during the operation of the electronic module.

According to an embodiment example, the first adhesion layer or dielectric layer is made from a full-surface layer with at least one clearance hole, filled with an electrically conductive material as electrical contact for the electrical connection of the first main surface of at least one electronic chip. The clearance holes can be designed after the mounting of the electronic chips between the two substrates with a respective adhesion layer or dielectric layer, for example by means of etching, and subsequently be designed further by means of cutting off of electrically conductive material to an electrical contact to form a targeted electrical coupling of pads of the electronic chips with the electronic periphery. To couple specifically individual areas of electronic chips electrically with the environment or to decouple electrically from the environment, a respective adhesion layer or a dielectric layer can be made advantageously of an electrically insulating material.

According to an embodiment example, the at least one electronic chip is mounted on the first adhesion layer or dielectric layer and on the second adhesion layer or dielectric layer is this way that the at least one clearance hole is adjacent to the respective of the main surfaces of the at least one electronic chip.

According to an embodiment example, the electronic module has a plurality of electronic chips, wherein every one of which is mounted with its first main surface on the first adhesion layer or dielectric layer and with its second main surface on the second adhesion layer or dielectric layer in this way, that a part of at least one of the first adhesion layer or dielectric layer and the second adhesion layer or dielectric layer remains uncovered of the plurality of electronic chips. In other words, the area of a respective adhesion layer or dielectric layer can be considerably larger than the sum of the respective first or second main surfaces of the electronic chips to be mounted thereon. Thus, due to the essentially full-surface providing of the respective adhesion layer or dielectric layer, a delimited mounting area is assigned not to each of the electronic chips, but rather, it is provided a continuous connected adhesion layer or dielectric layer, covering even several electronic chips, what allows a manufacturability with higher homogeneity.

According to an embodiment example, at least one of the first adhesion layer or dielectric layer and of the second adhesion layer or dielectric layer is designed of a polymer or a resin. Each of the adhesion layers of the dielectric layers can thus be executed as an adhesion layer, on which the electronic chips can be mounted without strong temperature influence. It is possible that such adhesion layers will be hardened after mounting the chips. It is also possible that such adhesion layers before mounting of an electronic chip will be pre-treated to improve the mounting properties, in particular at least partially pre-dried.

According to an embodiment example, the electronic module has a dielectric structure (electrically insulating) in at least a hollow space, which can be limited, for example, vertically between the first dielectric layer and the second dielectric layer and laterally through at least one electronic chip. Through mounting such a dielectric structure in hollow spaces between the substrates and the mounted electronic chip(s), unwanted empty spaces can be filled and at the same time used advantageously for mounting of the dielectric structure on two substrates, from which adhesion layers of dielectric layers are extending over the chips.

In accordance with an embodiment example, the dielectric structure is designed as a prepreg structure. Prepreg (pre-impregnated fibers) can indicate in particular a semi-finished product made of endless fibers and an unhardened thermosetting plastic matrix, especially epoxy-coated glass fibers. Prepreg can be obtained as sheet or wrapped on rolls. Such prepreg structure offers the advantage that it can be manufactured in a structured way (in particular as a perforated foil with cut-outs, for example, blind or clearance holes on the positions of the later electronic chips) and can be mounted between the two opposite adhesion layers or dielectric layers. Prepreg material can be adhesive and fluid under pressure and/or temperature influence and thus act as both the connection structure and the dielectric structure. This allows the electronic chips in the electronic module to be mechanically stabilized and to fill the hollow spaces.

According to an embodiment example, at least one of the first adhesion layer or dielectric layer and the second adhesion layer or dielectric layer designed of a first part layer on the respective substrate and of a separate second part layer on the first part layer. The first part of layer ensures that a reliable electrical insulation between the respective substrate and the electronic chip is guaranteed. To enhance the reliability in this respect, the first part of layer before applying the second part of layer can optionally pre-dried or otherwise treated to increase its strength to maintain the electrical insulation during the chip assembly process. After placing the second part of layer, the electronic chip can be pressed with relatively larger mounting force and thus be impressed on the second part of layer, without the risk of loss of electrical insulation, because of providing of the first part of layer.

According to an embodiment example, the first part of layer is manufactured on a material, which is different from a material of the second part of layer. Through a different choice of the material composition of the two parts of layer, each of them can be optimized on its function, i.e. electrical insulation of the substrate or mounting of electronic chip.

According to an embodiment example, the first part of layer will be dried or partially solidified, before the second part of layer will be applied. This increases the mechanical robustness of the first part of layer and builds thus a reliable barrier to maintain the electrical insulation through the first part of layer, if after that the electronic chip will be mounted on the second part of layer.

According to an embodiment example, the electronic module has two electronic chips, wherein one of them has its active side on his first main surface and the other has its active side on his second main surface. This allows even complex circuits to be built with low manufacturing effort and especially low wiring effort.

According to an embodiment example, the electronic module can have at least one clearance hole filled with conductive material (particularly one via), which extends vertically to the first substrate and a second substrate to build an electrical coupling of the first substrate with the second substrate. In volume ranges of the electronic module not occupied through electronic chips, also an electrical coupling can be realized between the two substrates in vertical direction. Through such clearance holes filled with conductive material, even pads on different main surfaces of electronic chips can be connected together electrically.

According to an embodiment example, at least one of the first substrate and a second substrate can be structured during the manufacturing process, in particular by means of etching, to make thus electrically conductive paths. The substrates are used during the manufacturing process as stability structures to the intermediate ordering of the electronic chips and can be structured after completion of chip mounting to achieve desired electrical couplings and de-couplings between individual components of the electronic chip.

According to an embodiment example, at least one of the first adhesion layer or dielectric layer and the second adhesion layer or dielectric layer be can be hardened or will be hardened. After the electronic chip is mounted on a corresponding adhesion layer, the material of the adhesion layer ca be heartened through respective handling (for example, thermal treatment, pressure treatment, etc.) to keep a mechanical solid and robust electronic module.

According to an embodiment example, the electronic module has a plurality of electronic chips, which are electrically coupled with each other by means of the electrical contacts on at least one of the first main surface and on the second main surface. For a specific targeted coupling of pads of electronic chips on laterally adjacent positions at the same level, the built electrical contact structures can be used acting together with corresponding sections of the respective substrate. It is also possible to manage a contacting of the specific pads of electronic chips through vias, which can be fitted, for example, through the dielectric structure.

According to an embodiment example, at least one of the first adhesion layer and a second adhesion layer on the respective substrate will be applied by means of pressing, in particular by means of silk-screen. An imprint of a respective adhesion layer on a particular substrate has proven as easy way to apply an adhesion layer of homogeneous thickness on the substrate, wherein a later incorrect mounting of electronic chips on this adhesion layer will be avoided through tilting or of that kind.

According to an embodiment example, at least one clearance hole will be made in at least one of the first adhesion layer or dielectric layer and of the second adhesion layer or dielectric layer for the electric connection of the respective main surface of the respective electronic chip. According to an embodiment example, during the forming of at least one clearance hole in the respective adhesion layer or dielectric layer, even at least a corresponding clearance hole in the corresponding substrate will be formed. This allows access to connection pads of electronic chips. Beneficially, for example, a clearance hole in a common lithography and etching method both through a specific adhesion layer or dielectric layer and through an adjoining substrate can be made.

According to an embodiment example, the at least one clearance hole for electrical contacting of the respective main surface of the respective electronic chip will be filled at least partially with conductive material. This can be done for example with a separation process. According to an embodiment example, the filling of the at least one clearance hole with electrically conductive material will be performed by means of one of the group, which consists of current-less coating, electrochemical coating and direct metallization.

According to an embodiment example, the method has a separating of a plurality of electronic chips between the first substrate and the first adhesion layer or dielectric layer on the one hand and the second substrate and the second adhesion layer or dielectric layer on the other hand, to a plurality of electronic modules or packages, of which any one section of the first substrate, a section of the first adhesion layer or dielectric layer, a section of the second substrate, a section of the second adhesion layer or dielectric layer and at least one electronic chip. Thus, the double-sided mounting of a plurality of electronic chips can be done in batches for a plurality of electronic modules, as well as the filling of hollow spaces and forming of a contacting structure. For this, the availability of large scale foils as substrates and the use of large adhesion layers and dielectric layers are in particular beneficial. After the joint, parallel processing (on chip mounting, providing a dielectric structure in form of one or more hole foils with cut-outs on positions of the respective chips, as well as and mounting the components next to each other), a separation of the resulting arrangement in the individual or separate electronic modules can be performed, for example, by means of etching or by means of sawing or by means of a suitable laser treatment.

According to an embodiment example, the electronic chips can be used as sensors or actuators in micro-electro-mechanical systems (MEMS), for example, as pressure sensors or acceleration sensors. In another embodiment example, the electronic chips can be used as semiconductor chips for power applications (especially with vertical current flow or with electrical contacts on two opposing main surfaces), for example, for automotive applications, and can have, for example, at least one integrated insulated gate bipolar transistor (IGBT) or at least one integrated diode. It is also possible that at least a part of the electronic chips is formed for performance applications, especially as a power semiconductor chip, for example, as a field-effect transistor (especially as MOSFET). According to an embodiment example, at least one electronic chip can be a logical IC (for example, with electrical contacts on only one of two opposing main surfaces) or an electronic chip for high-frequency power connections. Also, it is possible to use electronic chips as passive components, for example, resistors, coils or capacitors. The electronic module can be designed with respect to its electronic performance such as a DC-DC converter.

A semiconductor substrate can be used as a substrate or wafer to form the electronic chips, preferably a silicon substrate. Alternatively, silicon oxide or another electrically insulating substrate can be used. It is also possible to use a germanium substrate or an III-V semiconductor material. For example, exemplary embodiments can be realized in gallium nitride and silicon carbide technology. In addition, exemplary embodiments examples of standard semiconductor process technologies can be used, for example a suitable etching technology (showing on isotropic and anisotropic etching, in particular plasma etching, dry etching, wet etching), structuring technology (which can involve lithographic masks) or the separation technologies (such as, for example, chemical vapor separation (CVD), plasma enhanced chemical vapor separation (PECVD), atomic layer separation (ALD), sputtering, etc.).

The above described and other objectives, characteristics and advantages will become more recognizable on the basis of the following description and the accompanying patent claims, if they will be considered in relation to the attached drawings, in which appropriate parts or elements with appropriate references are provided.

BRIEF DESCRIPTION OF THE DRAWINGS

Exemplary embodiments are illustrated in the figures and will be discussed in detail below.

It shows:

FIG. 2 to FIG. 11: Cross-section views of structures, which during a process for the manufacturing of electronic modules are obtained in accordance with an exemplary embodiment example.

DETAILED DESCRIPTION OF EMBODIMENT EXAMPLES

The same or similar components in different figures are provided with the same reference numbers.

Figure 1:
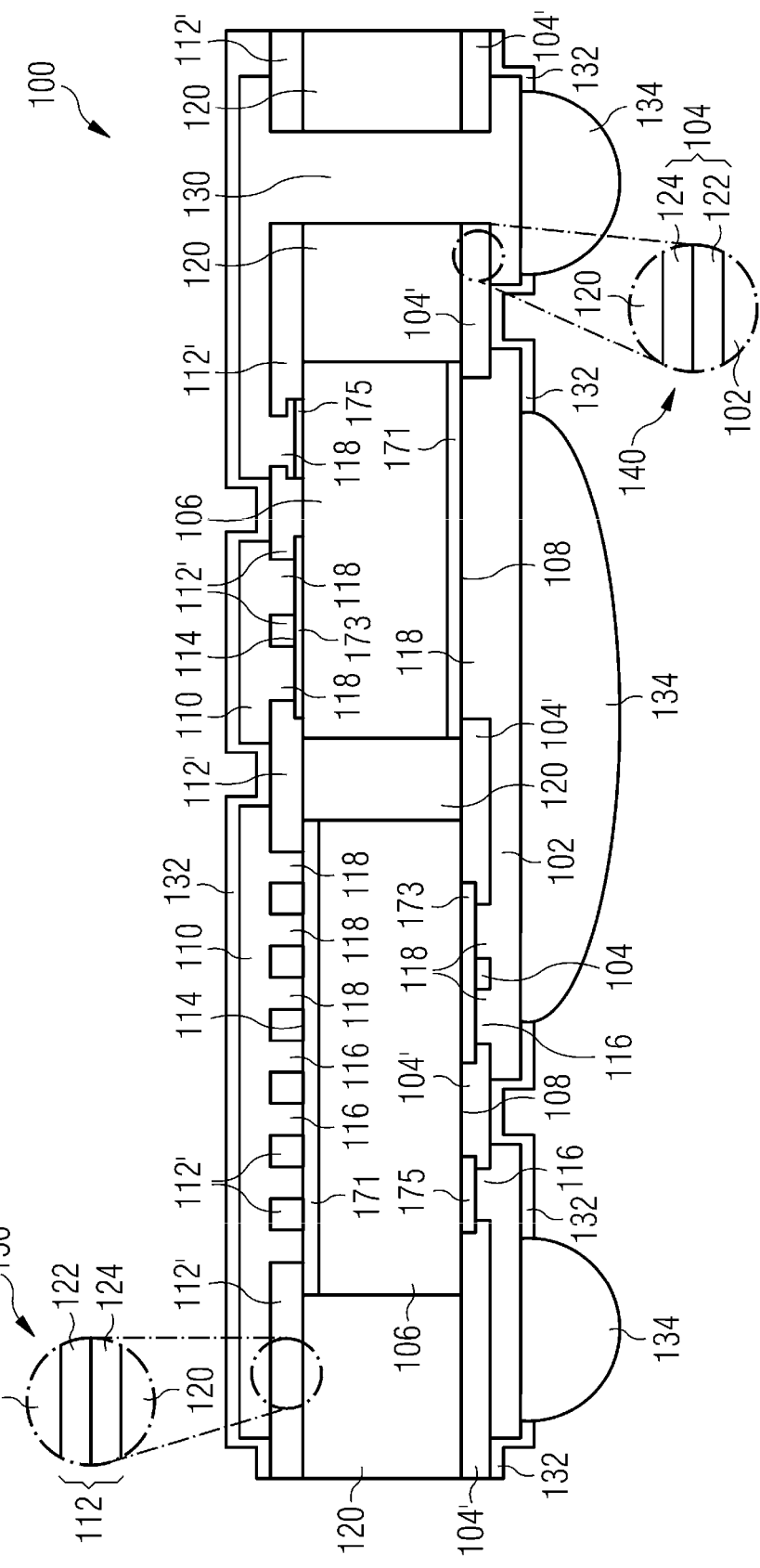
FIG. 1: a cross-sectional view of an electronic module according to an exemplary embodiment example.

FIG. 1 illustrates a cross-sectional view of an electronic module 100 according to an exemplary embodiment example.

The electronic module 100 shown in FIG. 1 has a first substrate 102 designed as a structured copper foil, a related first dielectric layer 104' made of adhesive resin on the first substrate 102 and two electronic chips 106 designed here as a MOSFET power semiconductor chips. Each of the electronic chips 106 is mounted with one or two pads 171, 173, 175 on its first main surface 108 directly on a section area of the first dielectric layer 104'.

The electronic module 100 has also a second substrate 110, designed as a structured copper foil, and a related second dielectric layer 112' made of adhesive resin on the second substrate 110. Thus the first substrate 102 and the second substrate 110 are designed of an electrically conductive and thermally conductive material. On the other hand, the first dielectric layer 104' and the second dielectric layer 112' are designed of an electrically insulating material. The materials of the first dielectric layer 104' and the second dielectric layer 112' can be soft to provide a good adhesive ability during the applying and can be hardened or dried to the complete manufacturing of the electronic module 100. Each of the electronic chips 106 is mounted with one or two pads 171, 173, 175 on its second main surface 114 (which is opposite to the first main surface 108) directly on a section area of the second dielectric layer 112'.

In addition, an electric contact 116 of copper is made for electrical contacting of electronic chips 106 through the first dielectric layer 104' and the second dielectric layer 112' as electrically conductive structure. The electrical contacting 116 fills clearance holes 118, which penetrate the first dielectric layer 104' and the second dielectric layer 112'. The electronic chips 106 are so mounted between the first dielectric layer 104' and the second dielectric layer 112' that metal-filled clearance holes 118 are adjacent of a current respective of the main surfaces 108, 114 of the respective electronic chip 106 and thus to its respective pads 171, 173, 175.

As it is illustrated in FIG. 1, a part of the first dielectric layer 104' and a part of the second dielectric layer 112' of the electronic chips 106 remain uncovered. Such uncovered sections of dielectric layers 104', 112' of the electronic chips 106 connect a dielectric structure 120 which is filling hollow spaces between the first dielectric layer 104' and the second dielectric layer 112'. The dielectric structure 120 can be designed, for example, as laminate or melting resin foil. The dielectric structure 120 can be designed as section of a perforated foil and is structured in such a way that it fills the targeted gaps between the electronic chips 106 on the first dielectric layer 104'.

How it is evident on the basis of a first detail 140 and a second detail 150 in FIG. 1, in accordance with the execution example, both the first dielectric layer 104' and the second dielectric layer 112, each consisting of a first part of layer 122, are mounted directly on the respective substrates 102, 110 and a separate second part of layer 124 on the first part of layer 122. The first part of layer 122 can be manufactured from a material that is different from a material of the second part of layer 124. It is also possible alternatively that the first part of layer 122 and the second part of layer 124 consist of the same material, but are applied in two separate procedures. It has been illustrated that thereby the mounting strength and the proper orientation of the electronic chips 106 will be particularly beneficial, without the electrical insulation between the electronic chips 106 and the respective substrates 102, 110 is at risk.

Two pads 173, 171 of the two electronic chips 106 are electrically coupled with each other on their first main surfaces 108 by means of the electrical contacting 116 and by means of a structured section of the first substrate 102. On the other hand, the two electronic chips 106 are each electrically decoupled on their second main surfaces 114.

A via 130 (as a clearance hole, that is filled with electrically conductive material) provides electrical coupling of the first substrate 102 with the second substrate 110 and extends vertically through the dielectric structure 120. Exposed electrical conductive surfaces on the bottom of the electronic module 100, which are mounted through the first substrate 102 and additional separated electrically conductive material, are covered with an electrical connector structure 134, designed here in the form of solder structures, to connect electrically the electronic module 100 with an electronic peripheral device not illustrated in FIG. 1 (in particular to solder it thereto). The top and bottom of the electronic module 100 (with the exception of the electrical connector structure 134) can be covered with a protective layer 132 (which can be also called passivation layer) to protect the electronic module 100 mechanically and to isolate it electrically. Optionally also the side areas of the electronic module 100 can be covered with a such protection layer 132, what, according to FIG. 1, due to the lateral continuously electrically insulating layers is not necessary.

Thus, FIG. 1 illustrates the electronic module 100 with the electronic chips 106 designed as semiconductor chips between the first substrate 102 as structured lower conductive layer and the second substrate 110 as structured upper electrically conductive layer. The two electronic chips 106 are adjusted in opposite directions to each other. Between the front and the back side of the electronic chips 106, on the one hand, and the substrates 102, 110, on the other hand, the dielectric layers 104', 112' are included as hardened polymer layers. Each of the dielectric layers 104' and 112' is designed in accordance with the embodiment example of two separate parts of layer 122, 124 with different material compositions. Metal vias as part of the electrical contacting 116 penetrate the dielectric layers 104, 112 in the form of the clearance holes 118 to connect electrically the two electronic chips 106 of two main surfaces 108, 114 with the electrically conductive layers in the form of the substrates 102, 110.

As illustrated in FIG. 1, the relevant dielectric layer 104', 112' of the electronic module 100 with the exception of electrical contacts (see reference marks 116, 118, 130) is mounted with full surface between the individual sections of the first substrate 102 on the one hand and the electronic chips 106/the dielectric structure 120 on the one hand or between the individual sections of the second substrate 112 on the one hand and the electronic chips 106/dielectric structure 120 on the other hand. Thus, the first dielectric layer 104' extends on the first substrate 102 over a surface area, which exceeds the overall length of the first main surface 108. In other words, the first dielectric layer 104' is so extensively mounted, that it is mounting more structural components of the electronic module 100 on the first substrate 102 over the mounting of electronic chips 106 on the first substrate 102. Similarly, the second dielectric layer 112' extends on the second substrate 110 over a surface area, which exceeds the overall length of the second main surface 114. In other words, the second dielectric layer 112' is mounted so extensively, that it is mounting more structural components of the electronic module of the second substrate 110 over the mounting of electronic chips 106 on the second substrate 110.

On the electronic module 100, electronic chips 106 are designed as field effect transistors (MOSFET). A particular drain pad is 171 is marked with reference mark 171, a particular source pad with reference mark 173 and a particular gate pad is marked with reference mark 175. FIG. 1 illustrates that one of the electronic chips 106 is arranged with its active side upwards, the other with its active site is arranged downwards.

FIG. 2 to FIG. 11 illustrate cross-sectional views of structures, which during the method for the manufacturing of electronic modules 100 are obtained in accordance with an exemplary embodiment example.

In the description of the electronic module 100, referring to FIG. 1, it was spoken about dielectric layers 104', 112'. Dielectric layers 104', 112' can be obtained, when adhesion layers 104, 112 which were mounted during the manufacturing process and afterwards closer described will be hardened.

Figure 2:
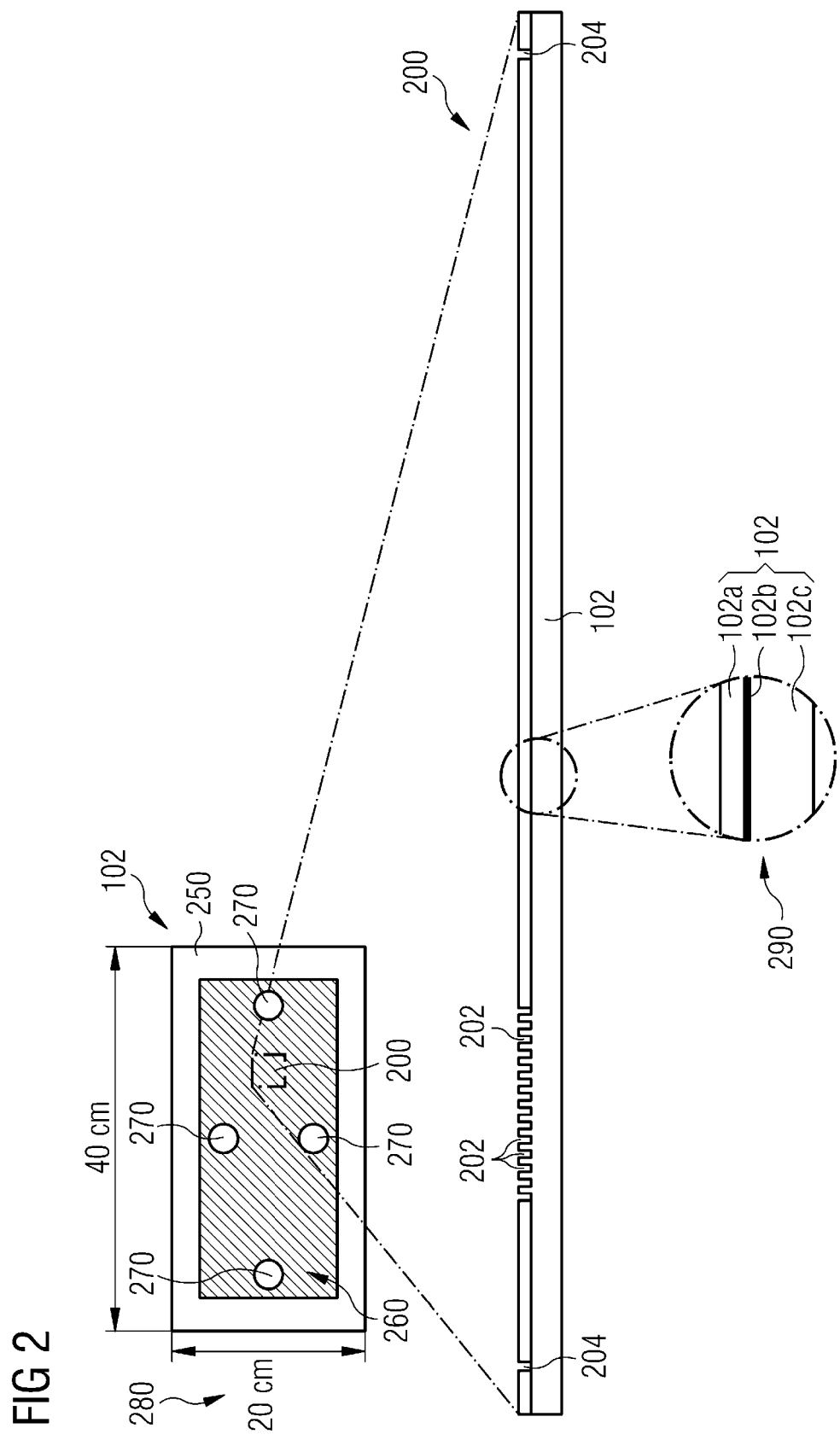

To get a structure 200 illustrated in FIG. 2, a foil layer stack as a first substrate 102 is provided. Optionally (for example using drilling, or etching, or a laser treatment, for example an UV-laser treatment), in a main surface of the first substrate 102, a plurality of blind holes 202 (as pre-structures, which later can be used as a base for making openings, for example, two-dimensional holes or vias, for the rear contact of electronic chips 106) or at least an alignment mark 204 (here in the form of a register hole). The alignment marks 204 can be used as an alignment aid when placing the electronic chips 106 (see FIG. 4), when mounting a dielectric structure 120 (see FIG. 6), in the composition of vias (see FIG. 8) or be used in lithographic etching of electrical conductive structures (see FIG. 10), to perform exactly position of the corresponding procedure. The blind holes 202 serve as rear connectors for the electronic chips 106.

FIG. 2 illustrates a detail 280, representing a top view of the first main surface of the first substrate 102. There also a component mounting area 260 is illustrated which corresponds to the main part of the first main surface of the first substrate 102, except only a ring-shaped edge area 250 and alignment marker 270 in the central area. The structure illustrated in FIG. 2 200 corresponds to a small central section of the component mounting area 260 of the first substrate 102, that can be dimensioned for example with a length of 40 cm and a width of 20 cm. The component mounting area 260 corresponds to the range of the first substrate 102, which after the processing and separating, how as referring to FIG. 11 closer described, a basis for the individual electronic modules to be manufactured. This component mounting area 260 will be, how referring to FIG. 3 described in more detail, completely or fully covered with adhesive material. The same applies to a below described second substrate 110 (see FIG. 6), which component mounting area 260 will be also completely or fully covered with adhesive material.

Another detail 290 in accordance with FIG. 2 illustrates that the first substrate 102 upon closer inspection as a layer stack can be made of three components. A temporary carrier 102c is a copper structure (alternatively made of aluminum or nickel) with a thickness of for example 70 μm. One carrier 102b, for example, only a few nanometers thick, separates the temporary carrier 102c by a functional layer 102a, which can be, for example, a copper layer with a thickness of 9 μm. The temporary carrier 102c simplifies the handling of the thin first substrate 102 for the chip mounting. The providing of the separation layer 102b allows a detachment of the temporary carrier 102c from the functional layer 102a (see junction from FIG. 7 to FIG. 8). It is possible, that the blind holes 202 and the alignment marks 204 extend only through the functional layer 102a, but not through the temporary carrier 102c.

Figure 3:
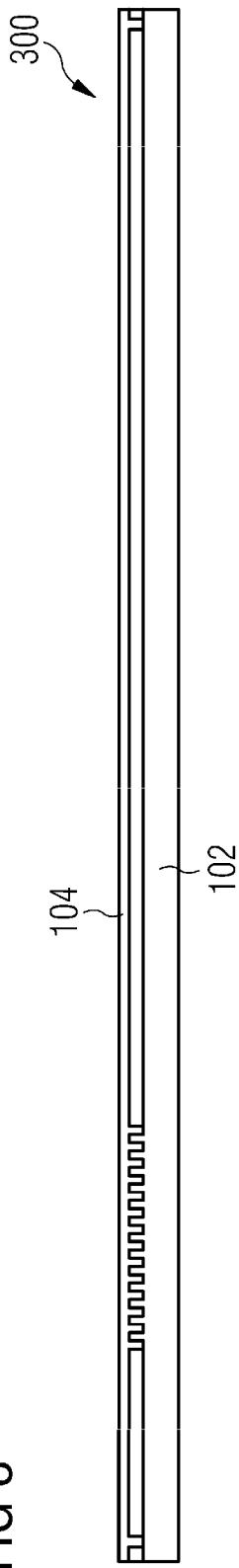

To get a structure 300 illustrated in FIG. 3 starting from the structure 200, a first adhesion layer 104 will be mounted fully on the first substrate 102 by means, for example, of pressing, or separating, or lamination (i.e. connection by pressing under high pressure) to cover its component mounting area 260 completely and fully. In particular also the blind holes 202 will be covered with the adhesive material (such as resin) of the first adhesion layer 104. The material of the first adhesion layer 104 can be optionally pre-dried or treated in any other way, so that it retains even a desired level of stickiness. For example, a thickness of the first adhesion layer 104 can be adjusted in a range between 5 μm and 100 μm (as well as a thickness of a second adhesion layer 112, which will be mounted in a later process step), in particular in a range between 20 μm and 30 μm.

It is also optionally possible to mount the first adhesion layer 104 from two partial layers (see reference marks 122, 124 in FIG. 1), wherein the first partial layer can be treated at first (for example, can be pre-dried), before the second partial layer is mounted.

Figure 4:
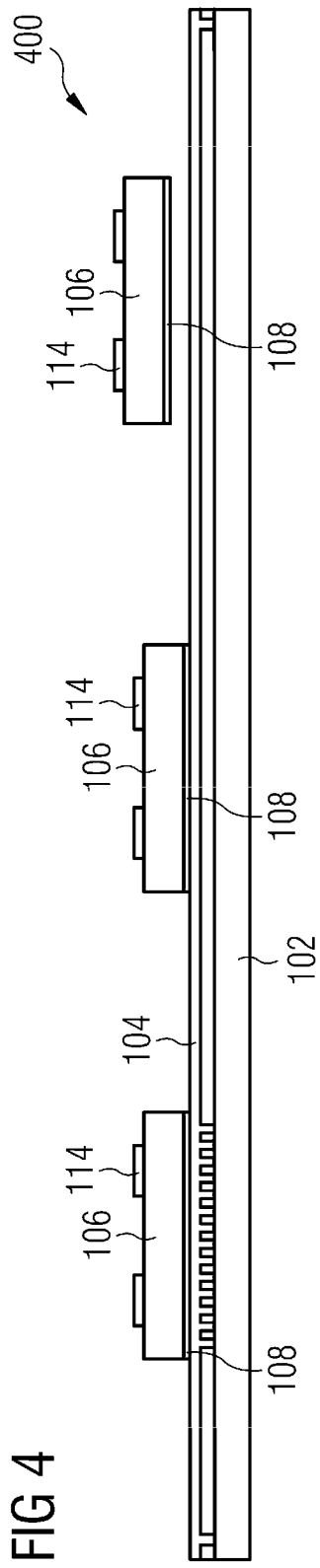

To get a structure 400 illustrated in FIG. 4 starting from the structure 300, a plurality of electronic chips 106 will be put on the first adhesion layer 104 with their respective first main surfaces 108 and thereby attached by means of glue and mounted on the first substrate 102. The mounting of electronic chips 106 on the sticky and still wet first adhesion layer 104 can be done by means of a Pick & Place machine with a high speed. During this procedure, the alignment of the electronic chips 106 relative to the first adhesion layer 104 and the first substrate 102 can be performed using the alignment marks 204.

Figure 5:
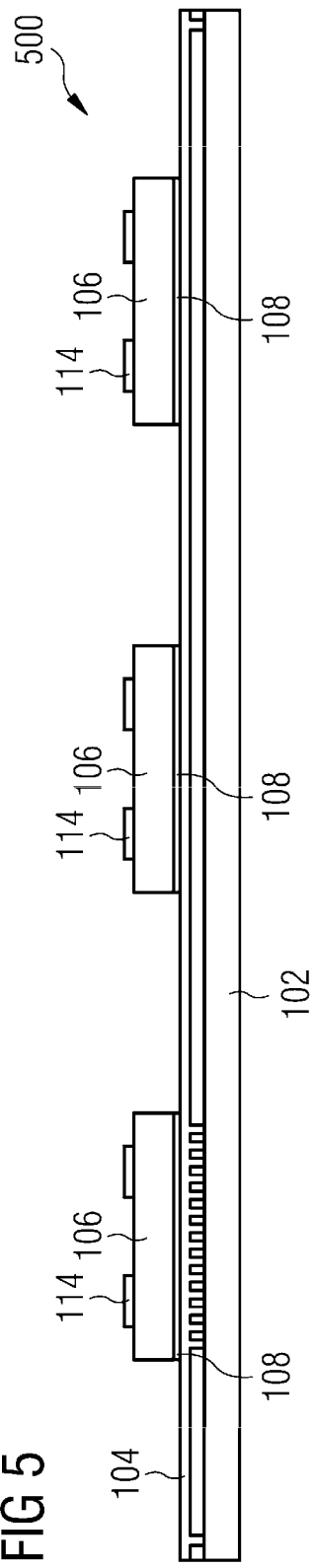

To get a structure 500 illustrated in FIG. 5 starting from the structure 400, the material of the first adhesion layer 104 will be at least partially dried or at least partially hardened to remove contained solvent in the adhesive material, to improve the handling of the already mounted electronic chips 106 and to strengthen the adhesion.

Figure 6:
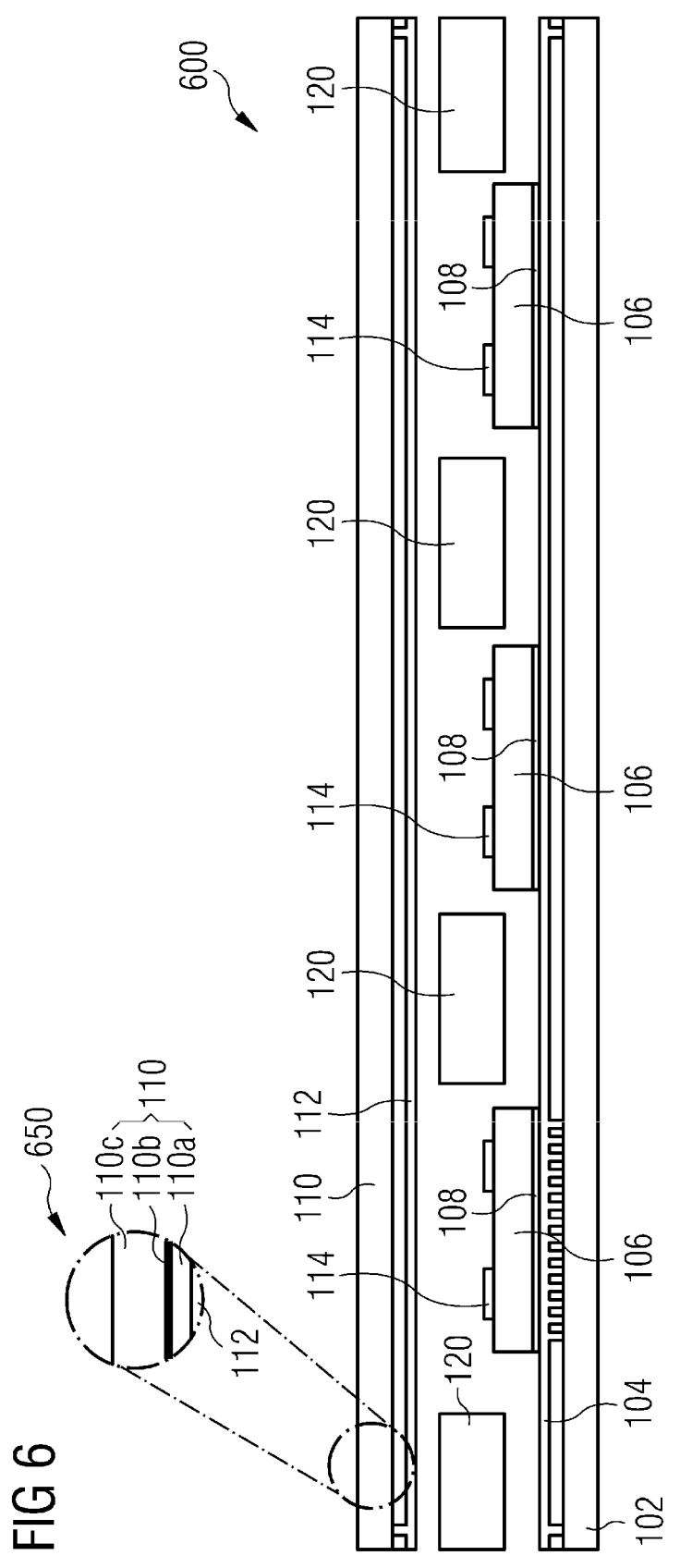

To get a structure 600 illustrated in FIG. 6 starting from the structure 500, at first, the second substrate 110 which is mounted as foil stack in its component mounting area 260 (see according to detail 280 in FIG. 2) will be fully equipped with a second adhesion layer 112 made from adhesive material.

A detail 650 according to FIG. 6 illustrates that the second substrate 110 upon closer inspection can be designed as a layer stack of three components. A temporary carrier 110c is a copper structure with a thickness of, for example, 70 μm (alternatively made of aluminum or nickel). One carrier layer 110b, for example, only a few nanometers thick, separates the temporary carrier 110c by a functional layer 110a, which can be, for example, a copper layer with a thickness of 9 μm. The temporary carrier 110c simplifies the handling of thin second substrate 110 during the bonding. The providing of the separation layer 110b allows a detachment of the temporary carrier 110c from the functional layer 110a (see junction from FIG. 7 to FIG. 8).

Although this is not illustrated in the figure, is it optionally possible to mount one or more electronic chips 106 on the formation of the second substrate 110 and the second adhesion layer 112 before the formation of the second substrate 110 and second adhesion layer 112 will be mounted on the formation of the first substrate 102 and the first adhesion layer 100 of the electronic chips 106 being mounted together.

The structure 500 according to FIG. 5 is connected with the second substrate 110 covered with a second adhesion layer 112, wherein the hollow spaces between them will be filled through a dielectric structure 120. The dielectric structure 120 can be provided in the form of individual bodies or as structured or perforated layer and be made, for example, of prepreg material.

In this connection process, the second main surfaces 114 of the electronic chips 106 will be simultaneously connected with different sections of the second adhesion layer 112, as is illustrated in a structure 700 in FIG. 7. Because an additional electrically insulating layer in the form of adhesion layers 104, 112 is imprinted on the respective substrates 102, 110, it is beneficial, for example, just exactly one structured layer of prepreg as a dielectric structure 120 being sufficient to laminate the two substrates 104, 110 with each other including their mounting. The lamination can be done by means of a vacuum PCB laminator press. The layer of prepreg can also be replaced through a structured core layer. Although this is not illustrated in the figure, it is also possible to mount more electronic chips 106 on the second substrate 110 before mounting the substrates 102, 110 with each other.

To get a structure 800 illustrated in FIG. 8 starting from the structure 700, at first the temporary carriers 102c, 110c will be taken off or removed. In addition, clearance holes 118 to form micro vias will be created by means of etching or laser drilling, which extend through the substrates 102, 110 and adhesion layers 104, 112. Alternatively, it is possible to make the clearance holes 118 in the remains of the substrates of 102, 110 previously. Also a cleaning process can be carried out, if necessary.

To get a structure 900 illustrated in FIG. 9 starting from the structure 800, electrically conductive material on two opposite main surfaces of the structure 800 will be separated to make electrical contacts 116 in the clearance holes 118 and to increase the thickness of the substrates 102, 112. At first, a germ layer to the front and to the back can be made using an electro-less copper separation process, and after that can be continued with an electrochemical separation process or with a direct metal separation process.

To get a structure 1000 illustrated in FIG. 10 starting from the structure 900, the thickened substrates 102, 110 in accordance with the process of FIG. 9 will be structured, for example, by means of lithography or etching method, wherein the individual pads of each electronic chips 106 stay electrically coupled with each other in a desired manner to one part or will be electrically decoupled from each other to another part. As an alternative to such developing-etching-stripping method, even a structured separation method can be used.

Although this is not illustrated in the figure, it is possible to mount more layers on the upper or lower side of the structure 1000. It is also possible to install solder structures, to perform a finishing process, etc.

To get the electronic modules 100 illustrated in FIG. 11 starting from the structure 1000, the structure 1000 will be separated on separating lines 1002, for example, by means of etching, laser treatment, or sawing, wherewith the electronic modules 100 will be singularized.

A conversion of the adhesion layers 104, 112 (compare FIG. 3 to FIG. 11) in the dielectric layers 104', 112' (compare FIG. 1), in particular through hardening, can be performed to one or more different times during the manufacturing method (for example, in the phase in accordance with FIG. 5, FIG. 7, FIG. 8 and/or FIG. 11, or in other phases).

Instead of the processes referring to described in FIG. 9 to FIG. 11, it is alternatively possible to use other contact manufacturing methods, as they are known from the conventional printed circuit technology.

The description referred to in FIG. 2 to FIG. 11 illustrates that a large part of the processes for the production of electronic modules 100, according to exemplary embodiment examples, can be performed as batch-process, i.e. for many electronic modules 100 in a common parallel manufacturing method. However, it is also possible to perform individual of the listed above processes only after singularizing, for example, the mounting of solder structures (see reference mark 134 in FIG. 1).

A professional will recognize that many alternatives to the described manufacturing methods are possible. According to another option, it is possible, at first, to mount the electronic chips 106 to the adhesion layers 104, 112 with heat. In addition, it is possible to mount multiple-layer adhesion layers 104, 112, wherein a first respective mounted part of layer can be at first hardened, before a respective different part layer is mounted. In this case, it may be possible to omit a dielectric structure 120 at all. It is also possible to pre-laminate a dielectric structure 120 (for example made as a core layer) before the actual bonding. In addition, it is possible to arrange the electronic chips 106 on still wet adhesion layers 104, 112 before the adhesive material is hardened. It is possible to bond electronic chips 106 on two opposite substrates 102, 110 by the means of the adhesion layers 104, 112. A front side-back side connection can be made by means of drilled or etched clearance holes.

In addition, it shall be pointed out that "comprising" does not exclude any other elements or steps and "one" or "a" do not exclude any plurality. It also should be pointed out that features or steps, which have been described with reference to one of the above embodiment examples, can be used also in combination with other features or steps of other of the embodiment examples described above. Reference marks in the claims shall not be understood as restrictions.

What is claimed is:

1. A method of manufacturing at least one electronic module, the method comprising:
    applying a first adhesion layer at least to an entire component mounting area of a conductive first substrate;
    direct or indirect mounting of a first main surface of at least one electronic chip on a partial region of the first adhesion layer;
    applying a second adhesion layer on the second substrate;
    direct or indirect mounting of the second main surface of at least one electronic chip on a section of the second adhesion layer;
    electrical contacting of the at least one electronic chip through the first adhesion layer; and
    singularizing of a plurality of electronic chips between the first substrate and the second substrate to a plurality of electronic modules, wherein each electronic module comprises at least a section of the first substrate, a section of the first adhesion layer wherein edges of the first adhesion layer are exposed, a section of the second substrate, and at least one electronic chip.

2. The method of claim 1, wherein the second adhesion layer is applied at least to an entire component mounting area of the second substrate.

3. The method of claim 1, wherein at least one of the first adhesion layer and of the second adhesion layer is applied essentially completely on the respective substrate.

4. The method of claim 1, wherein at least one through hole for electrically contacting the respective main surface of the respective electronic chip is formed in at least one of the first adhesion layer and of the second adhesion layer.

5. The method of claim 4, wherein the at least one through hole for electrically contacting the respective main surface of the respective electronic chip is filled at least partially with electrically conductive material.

6. The method of claim 1, wherein at least one of the first adhesion layer and the second adhesion layer is formed of a first partial layer and a second partial layer on the first partial layer.

7. The method of claim 1, wherein at least one of the first substrate and the second substrate is structured to form electrically conductive paths.

8. The method of claim 1, wherein the first adhesion layer has a constant thickness throughout, except of the region where an electrical contacting is arranged.

9. A method for manufacturing at least one electronic module, the method comprising:
    applying a first adhesion layer at least to an entire component mounting area of a conductive first substrate;
    direct or indirect mounting of a first main surface of a plurality of electronic chips on a respective partial region of the first adhesion layer;
    applying a second adhesion layer on a conductive second substrate;
    direct or indirect mounting of a second main surface of the plurality of electronic chips on a respective partial region of the second adhesion layer; and
    singularizing of the plurality of electronic chips between the first substrate and the second substrate to a plurality of electronic modules, wherein each electronic module comprises at least a section of the first substrate, a section of the first adhesion layer wherein edges of the first adhesion layer are exposed, a section of the second adhesion layer wherein edges of the second adhesion layer are exposed, a section of the second substrate, and at least one electronic chip.

10. The method of claim 9, wherein the second adhesion layer is applied at least to an entire component mounting area of the second substrate.

11. The method of claim 9, wherein at least one of the first adhesion layer and the second adhesion layer is applied essentially completely on the respective substrate.

12. The method of claim 9, wherein at least one through hole for electrically contacting the respective main surface of the respective electronic chip is formed in at least one of the first adhesion layer and the second adhesion layer.

13. The method of claim 12, wherein the at least one through hole for electrically contacting the respective main surface of the respective electronic chip is filled at least partially with electrically conductive material.

14. The method of claim 9, wherein at least one of the first adhesion layer and the second adhesion layer is formed of a first partial layer and a second partial layer on the first partial layer.

15. The method of claim 9, wherein at least one of the first substrate and the second substrate is structured to form electrically conductive paths.

16. The method of claim 9, wherein the first adhesion layer has a constant thickness throughout, except of the region where an electrical contacting is arranged.

17. A method for manufacturing at least one electronic module, the method comprising:
    applying a first adhesion layer at least to an entire component mounting area of a conductive first substrate, wherein the first adhesion layer has a constant thickness throughout, except of the region where an electrical contacting is arranged;
    direct or indirect mounting of a first main surface of a plurality of electronic chips on a respective partial region of the first adhesion layer;
    applying a second adhesion layer on a conductive second substrate, wherein the second adhesion layer has a constant thickness throughout, except of the region where an electrical contacting is arranged; and
    direct or indirect mounting of a second main surface of the plurality of electronic chips on a respective partial region of the second adhesion layer.

18. The method of claim 17, further comprising:
    singularizing of the plurality of electronic chips between the first substrate and the second substrate to a plurality of electronic modules, wherein each electronic module comprises at least a section of the first substrate, a section of the first adhesion layer wherein edges of the first adhesion layer are exposed, a section of the second adhesion layer wherein edges of the second adhesion layer are exposed, a section of the second substrate, and at least one electronic chip.

19. The method of claim 17, wherein at least one of the first adhesion layer and the second adhesion layer is applied essentially completely on the respective substrate.

* * * * *